(12) United States Patent
Tanaka et al.

(10) Patent No.: US 9,335,497 B2
(45) Date of Patent: May 10, 2016

(54) OPTO-ELECTRIC HYBRID BOARD

(71) Applicant: NITTO DENKO CORPORATION, Ibaraki-shi, Osaka (JP)

(72) Inventors: Naoyuki Tanaka, Ibaraki (JP); Yasuto Ishimaru, Ibaraki (JP)

(73) Assignee: NITTO DENKO CORPORATION, Ibaraki-shi (JP)

(\*) Notice: Subject to any disclaimer, the term of this patent is extended or adjusted under 35 U.S.C. 154(b) by 192 days.

(21) Appl. No.: 13/785,553

(22) Filed: Mar. 5, 2013

(65) Prior Publication Data
US 2013/0259430 A1  Oct. 3, 2013

(30) Foreign Application Priority Data
Mar. 29, 2012 (JP) .................................. 2012-077272

(51) Int. Cl.
*G02B 6/42* (2006.01)
*H05K 1/02* (2006.01)
*G02B 6/43* (2006.01)

(52) U.S. Cl.
CPC ............ *G02B 6/4214* (2013.01); *G02B 6/4204* (2013.01); *G02B 6/4206* (2013.01);
(Continued)

(58) Field of Classification Search
CPC .......... G02B 6/43; G02B 6/136; G02B 6/138; G02B 6/4222; G02B 6/4221; G02B 6/122; G02B 6/12004; G02B 6/42; G02B 6/4201; G02B 6/4214; G03G 5/04
USPC ........... 385/14, 31–33, 39, 43, 51–52, 88–92, 385/129–132; 520/1
See application file for complete search history.

(56) References Cited

U.S. PATENT DOCUMENTS 5,101,454 A  *  3/1992  Blonder et al. ................. 385/14
2002/0118907 A1  8/2002  Sugama et al.
(Continued)

FOREIGN PATENT DOCUMENTS

CN  1576928 A  2/2005
CN  101939677 A  1/2011
(Continued)

OTHER PUBLICATIONS

European Search Report dated Jul. 9, 2013, issued in corresponding European Patent Application No. 13157566.4 (6 pages).
(Continued)

*Primary Examiner* — Akm Enayet Ullah
*Assistant Examiner* — Michael Mooney
(74) *Attorney, Agent, or Firm* — Westerman, Hattori, Daniels & Adrian, LLP

(57) ABSTRACT

An opto-electric hybrid board includes: an electric circuit board including an insulative layer having front and back surfaces, and electrical interconnect lines formed on the front surface of the insulative layer; an optical element mounted on a surface of the electric circuit board with the electrical interconnect lines formed thereon; and an optical waveguide including a core and formed on the back surface of the insulative layer of the electric circuit board. The core includes at its end portion a reflecting surface capable of reflecting a light beam to propagate the light beam between the core and the optical element. The insulative layer is made of a light-transmissive material. A portion of the insulative layer corresponding to an optical path between the reflecting surface of the core and the optical element is in the form of a lens portion.

11 Claims, 5 Drawing Sheets

(52) U.S. Cl.
CPC ............ *H05K1/0274* (2013.01); *G02B 6/4283* (2013.01); *G02B 6/43* (2013.01); *H05K 2201/10121* (2013.01)

(56) References Cited

U.S. PATENT DOCUMENTS

| | | | |
|---|---|---|---|
| 2004/0264848 A1* | 12/2004 | Lee et al. | 385/22 |
| 2009/0297096 A1 | 12/2009 | Hodono | |
| 2011/0052118 A1* | 3/2011 | Matsuoka | 385/14 |
| 2011/0080657 A1 | 4/2011 | Takai et al. | |

FOREIGN PATENT DOCUMENTS

| | | | | |
|---|---|---|---|---|
| JP | 2002-189137 A | 7/2002 | | |
| JP | 2002-258081 A | 9/2002 | | |
| JP | 2004-302188 A | 10/2004 | | |
| JP | 2004-361858 | * 12/2004 | ............... | G02B 6/12 |
| JP | 2004-361858 A | 12/2004 | | |
| JP | 2005-017678 A | 1/2005 | | |
| JP | 2005-181645 A | 7/2005 | | |
| JP | 2006-038958 A | 2/2006 | | |
| JP | 2006-52992 A | 2/2006 | | |
| JP | 2006-208527 A | 8/2006 | | |
| JP | 2009-288341 A | 12/2009 | | |
| JP | 2010-204504 A | 9/2010 | | |
| JP | 2011-81071 A | 4/2011 | | |
| JP | 2011-221142 A | 11/2011 | | |
| JP | 2012-037818 A | 2/2012 | | |

OTHER PUBLICATIONS

Office Action dated May 21, 2015, issued in counterpart Chinese Patent Application No. 201310066845.6, w/English translation. (15 pages).

Office Action dated Aug. 18, 2015, issued in counterpart Japanese application No. 2012-077272 (w/English translation) (10 pages).

Office Action dated Oct. 27, 2015, issued in counterpart Japanese Application No. 2012077272, with English translation. (8 pages).

Chinese Office Action with Search Report dated Dec. 10, 2015, issued in counterpart Chinese Patent Application No. 201310066845.6, with English translation. (17 pages).

* cited by examiner

RELATED ART

OPTO-ELECTRIC HYBRID BOARD

BACKGROUND OF THE INVENTION

1. Field of the Invention

The present invention relates to an opto-electric hybrid board in which an electric circuit board with an optical element mounted thereon and an optical waveguide are stacked together.

2. Description of the Related Art

With the increase in the amount of transmission information, optical interconnection in addition to electrical interconnection has been used in recent electronic devices and the like. As an example of such a technique, an opto-electric hybrid board has been disclosed in Japanese Published Patent Application No. 2009-288341. As shown in FIG. 7, this opto-electric hybrid board includes: an electric circuit board $E_0$ including an insulative layer 51, and electrical interconnect lines 52 formed on the front surface of the insulative layer 51; an optical waveguide (optical interconnect lines) $W_0$ (including an under cladding layer 56, cores 57 and an over cladding layer 58) stacked on the back surface (a surface opposite from the surface with the electrical interconnect lines 52 formed thereon) of the insulative layer 51 of the electric circuit board $E_0$; and a light-emitting element 11 and a light-receiving element 12 which are mounted on portions of the surface with the electrical interconnect lines 52 formed thereon, the portions corresponding to opposite end portions of the optical waveguide $W_0$. The opposite end portions of the optical waveguide $W_0$ are formed into inclined surfaces inclined at 45 degrees with respect to the electric circuit board $E_0$. Portions of each of the cores 57 positioned at the inclined surfaces function as first and second light reflecting surfaces 57a. Portions of the insulative layer 51 corresponding to the light-emitting element 11 and the light-receiving element 12 have first and second through holes 55, respectively, for an optical path. The first and second through holes 55 allow a light beam L to propagate therethrough between the light-emitting element 11 and the first light reflecting surface 57a provided in a first end portion of the optical waveguide $W_0$ and between the light-receiving element 12 and the second light reflecting surface 57a provided in a second end portion thereof.

The propagation of the light beam L in the aforementioned opto-electric hybrid board is performed in a manner to be described below. First, the light beam L is emitted from the light-emitting element 11 toward the first light reflecting surface 57a. The light beam L passes through the first through hole 55 for an optical path formed in the insulative layer 51, and then passes through the under cladding layer 56 in the first end portion (the left-hand end portion as seen in FIG. 7) of the optical waveguide $W_0$. Then, the light beam L is reflected from the first light reflecting surface 57a of each of the cores 57 (or the optical path is changed by 90 degrees), and travels through the interior of each core 57 in an axial direction. Then, the light beam L is reflected from the second light reflecting surface 57a provided in the second end portion (the right-hand end portion as seen in FIG. 7) of each core 57 (or the optical path is changed by 90 degrees), and travels toward the light-receiving element 12. Subsequently, the light beam L passes through the under cladding layer 56 in the second end portion, and travels outwardly of the optical waveguide $W_0$. Then, the light beam L passes through the second through hole 55 for an optical path, and is received by the light-receiving element 12.

However, the light beam L is diffused as shown in FIG. 7 when emitted from the light-emitting element 11 and when reflected from the second light reflecting surface 57a. Thus, the light beam L is low in the efficiency of propagation. To solve such a problem, Japanese Published Patent Application No. 2002-258081, for example, discloses a technique in which a lens 60 is mounted to an opening surface of the second through hole 55 for an optical path to change the light beam L passing through the second through hole 55 into a collimated light beam or a convergent light beam by the effect of the lens 60, as shown in FIG. 8. This technique changes the light beam L into a collimated light beam or a convergent light beam as mentioned above to achieve the efficient propagation of the light beam L.

However, the lens 60, which is mounted, involves the need for the step of mounting the lens 60, resulting in a problem such that the productivity is lowered. The process of mounting the lens 60 also results in a problem such that variations occur in the accuracy of the position of the mounting.

In view of the foregoing, an opto-electric hybrid board is provided which includes a lens formed in an optical path between an optical element and a core with stable positional accuracy without the decrease in productivity.

SUMMARY OF THE INVENTION

The opto-electric hybrid board comprises: an electric circuit board including an insulative layer having front and back surfaces, and electrical interconnect lines formed on the front surface of the insulative layer; an optical element mounted on a surface of the electric circuit board with the electrical interconnect lines formed thereon; and an optical waveguide including a core and formed on the back surface of the insulative layer of the electric circuit board, the core including at its end portion a reflecting portion capable of reflecting light to propagate the light between the core and the optical element, the insulative layer being made of a light-transmissive material, the insulative layer including a portion corresponding to an optical path between the reflecting portion of the core and the optical element, the corresponding portion of the insulative layer being in the form of a lens portion.

In the opto-electric hybrid board, the insulative layer is made of a light-transmissive material. This eliminates the need for the provision of a through hole for an optical path in a portion of the insulative layer corresponding to the optical path between the reflecting portion of the core and the optical element. Additionally, the portion of the insulative layer serving as the optical path is in the form of a lens portion. Thus, the lens portion is part of the insulative layer, and there is no need to mount a separate lens. In this manner, the opto-electric hybrid board eliminates the need for the step of forming a through hole for an optical path in the insulative layer and the step of mounting a lens in the optical path portion. This improves productivity. Further, since there is no need to mount a separate lens to the insulative layer as mentioned above, no variations occur in mounting position. This achieves the formation of the lens portion with stable positional accuracy.

Preferably, the light-transmissive material of the insulative layer is a photosensitive resin, and the lens portion is formed by gradation exposure during a photolithographic process. In such a case, the insulative layer with the lens portion is formed by a single photolithographic process. Therefore, the opto-electric hybrid board is excellent in productivity and in the positional accuracy of the lens portion.

Preferably, the insulative layer includes alignment marks formed thereon for the positioning of the electrical interconnect lines, and the electrical interconnect lines are formed using the alignment marks as a guide. In such a case, the opto-electric hybrid board is excellent also in the positional accuracy of the electrical interconnect lines.

Preferably, the insulative layer includes alignment marks formed thereon for the positioning of the optical element, and the optical element is mounted using the alignment marks as a guide. In such a case, the opto-electric hybrid board is excellent also in the positional accuracy of the optical element.

Preferably, the insulative layer has a light transmittance of not less than 70% at a wavelength of not less than 600 nm. In such a case, a greater amount of light is transmitted through the insulative layer. Thus, the coupling loss of light is decreased.

Preferably, the insulative layer is a heat-resistant layer having resistance to heat at 150° C. or higher. In such a case, the lens portion is prevented from becoming deformed due to heat produced during the mounting of the optical element. This allows the lens to perform a proper light-gathering effect.

DETAILED DESCRIPTION OF THE INVENTION

Preferred embodiments according to the present invention will now be described in detail with reference to the drawings.

Figure 1:
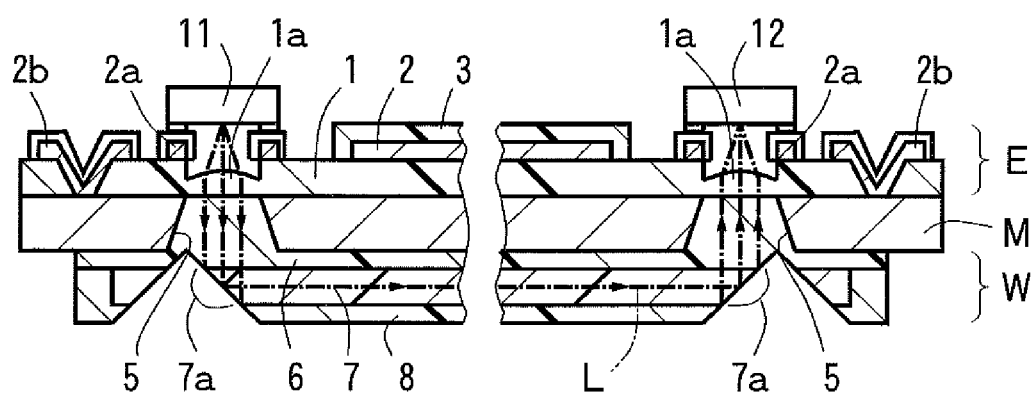
FIG. 1 is a longitudinal sectional view schematically showing an opto-electric hybrid board according to a first preferred embodiment.

FIG. 1 is a longitudinal sectional view schematically showing an opto-electric hybrid board according to a first preferred embodiment. The opto-electric hybrid board according to the first preferred embodiment is a strip-shaped opto-electric hybrid board extending leftwardly and rightwardly, and includes: an electric circuit board E including an insulative layer 1 having front and back surfaces, and electrical interconnect lines 2 formed on the front surface of the insulative layer 1; a light-emitting element 11 and a light-receiving element 12 which are mounted on a surface of the electric circuit board E with the electrical interconnect lines 2 formed thereon; an optical waveguide W formed on the back surface of the insulative layer 1 of the electric circuit board E; and a metal layer M formed between the optical waveguide W and the back surface of the insulative layer 1 of the electric circuit board E. The metal layer M has first and second through holes 5 for an optical path, which are in positions corresponding to the light-emitting element 11 and the light-receiving element 12, respectively. Notches of an inverted V shape are formed respectively in opposite end portions of the optical waveguide W corresponding to the light-emitting element 11 and the light-receiving element 12. Inclined surfaces of the inverted V-shaped notches are in the form of surfaces inclined at 45 degrees to the longitudinal direction of cores 7 of the optical waveguide W. The inclined surfaces serve as first and second reflecting surfaces 7a which reflect light beams to allow the propagation of the light beams between the light-emitting element 11 and each of the cores 7 and the propagation of the light beams between the light-receiving element 12 and each of the cores 7.

The insulative layer 1 is made of a light-transmissive material such as a transparent synthetic resin. A portion of the insulative layer 1 corresponding to an optical path lying between the first reflecting surface 7a provided in a first end portion of each of the cores 7 and the light-emitting element 11 is in the form of a first lens portion 1a having a convex curved surface bulging toward the light-emitting element 11. A portion of the insulative layer 1 corresponding to an optical path lying between the second reflecting surface 7a provided in a second end portion of each of the cores 7 and the light-receiving element 12 is in the form of a second lens portion 1a similar to the first lens portion 1a. The insulative layer 1 itself is made of a light-transmissive material, and portions of the insulative layer 1 corresponding to the optical paths are in the form of the lens portions 1a.

The propagation of a light beam in the aforementioned opto-electric hybrid board is performed in a manner to be described below. A light beam L is emitted in a diffused manner from the light-emitting element 11 toward the first reflecting surface 7a provided in the first end portion (the left-hand end portion as seen in FIG. 1) of each core 7. The light beam L initially passes through the first lens portion 1a of the insulative layer 1. When the light beam L passes through the first lens portion 1a, the diffused light beam L is changed into a collimated light beam or a convergent light beam (a collimated light beam as seen in FIG. 1) by the effect of the first lens portion 1a. After passing through the first through hole 5 formed in the metal layer M, the light beam L is reflected from the first reflecting surface 7a provided in the first end portion of each core 7, and travels through the interior of each core 7 in an axial direction. Then, the light beam L is reflected from the second reflecting surface 7a provided in the second end portion (the right-hand end portion as seen in FIG. 1) of each core 7, and passes through the second through hole 5 formed in the metal layer M and through the second lens portion 1a of the insulative layer 1. When the light beam L passes through the second lens portion 1a, the light beam L is changed into a convergent light beam by the effect of the second lens portion 1a. Then, the light beam L is received by the light-receiving element 12. In this manner, the light beam L is changed into a collimated light beam or a convergent light beam by the effect of the first and second lens portions 1a of the insulative layer 1, when emitted from the light-emitting element 11 and entering the first end portion of each core 7 and when reflected from the second reflecting surface 7a provided in the second end portion of each core 7 and received by the light-receiving element 12. This achieves the efficient propagation of the light beam L.

Additionally, there is no need to mount a separate lens because the lens portions 1a of the insulative layer 1 are parts of the insulative layer 1. This eliminates the need for the step of mounting a lens, thereby causing to cause no variations in mounting position resulting from the mounting of the lens. In other words, the opto-electric hybrid board is excellent in productivity and in the positional accuracy of the lens portions 1a.

In opposite longitudinal end portions of the electric circuit board E according to the first preferred embodiment, uncovered optical element mounting pads 2a are formed on the front surface of the insulative layer 1, and uncovered grounding electrodes 2b extend through the insulative layer 1 into contact with the metal layer M on the back surface of the insulative layer 1. The optical element mounting pads 2a and the grounding electrodes 2b are portions of the electrical interconnect lines 2. Portions of the electrical interconnect lines 2 other than the optical element mounting pads 2a and the grounding electrodes 2b are covered with a coverlay 3, and are insulated and protected.

The optical waveguide W includes an under cladding layer 6, the cores 7 formed in a predetermined pattern on the front surface (the lower surface as seen in FIG. 1) of the under cladding layer 6, and an over cladding layer 8 formed on the front surface of the under cladding layer 6 so as to cover the cores 7. The under cladding layer 6 has a back surface (a surface opposite from the surface with the cores 7 formed thereon) in contact with the metal layer M, and enters and fills the first and second through holes 5 for an optical path formed in the metal layer M.

Next, a method of manufacturing the opto-electric hybrid board will be described (with reference to FIGS. 2A to 2E, and 3A to 3D).

First, the metal layer M of a flat configuration (with reference to FIG. 2A) is prepared. Examples of a material for the formation of the metal layer M include stainless steel, and 42 alloy. In particular, stainless steel is preferable from the viewpoint of dimensional accuracy and the like. The metal layer M has a thickness in the range of 10 to 100 µm, for example.

Figure 2A:
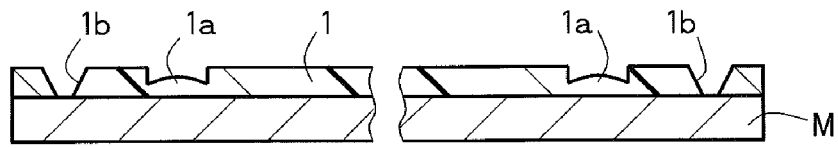
FIGS. 2A to 2D are illustrations schematically showing the steps of producing an electrical circuit board in the opto-electric hybrid board.

Next, as shown in FIG. 2A, a photosensitive insulating resin is applied to the front surface of the metal layer M to form the insulative layer 1 having a predetermined pattern by a photolithographic process. In the first preferred embodiment, predetermined portions of the insulative layer 1 are formed into the first and second lens portions 1a by gradation exposure. At the same time, holes 1b which uncover the front surface of the metal layer M are formed in the opposite longitudinal end portions, respectively, of the insulative layer 1 for the purpose of forming the grounding electrodes 2b for contact with the metal layer M. In this manner, the present method of manufacturing the opto-electric hybrid board does not require the step of mounting a separate lens because the predetermined portions of the insulative layer 1 are formed into the lens portions 1a at the same time that the insulative layer 1 is formed. Thus, the present manufacturing method is excellent in productivity and in the accuracy of the position where the lens portions 1a are formed.

Examples of a material for the formation of the insulative layer 1 include synthetic resins such as polyimide, polyether nitrile, polyether sulfone, polyethylene terephthalate, polyethylene naphthalate and polyvinyl chloride, and silicone-base sol-gel materials. In particular, a photosensitive polyimide excellent in heat resistance and in insulating properties and having a total light transmittance of not less than 70% at a wavelength of not less than 600 nm is preferable. It is also preferable that the material for the formation of the insulative layer 1 has resistance to heat at 150° C. or higher from the viewpoint of preventing the lens portions 1a from becoming deformed due to heat produced during the mounting of the light-emitting element 11 and the light-receiving element 12. The insulative layer 1 has a thickness in the range of 3 to 100 µm, for example. It should be noted that the aforementioned value of the total light transmittance is obtained by an integral type light transmittance measuring apparatus and method defined in JIS (Japanese Industrial Standards) K7105 "Testing Methods for Optical Properties of Plastics," 5.5 "Light Transmittance and Total Light Reflectance."

Figure 2B:
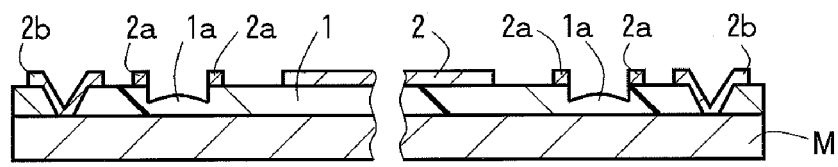

Next, as shown in FIG. 2B, the electrical interconnect lines 2 (including the optical element mounting pads 2a and the grounding electrodes 2b) are formed by a semi-additive process, for example. The semi-additive process is as follows. First, a metal film (not shown) made of copper, chromium and the like is formed on the front surface of the insulative layer 1 by sputtering, electroless plating or the like. This metal film serves as a seed layer (a layer serving as a basis material for the formation of an electroplated layer) for a subsequent electroplating process. Then, a photosensitive resist (not shown) is laminated to the opposite surfaces of a laminate comprised of the metal layer M, the insulative layer 1, and the seed layer. Thereafter, a photolithographic process is performed to form holes having the pattern of the electrical interconnect lines 2 (including the optical element mounting pads 2a and the grounding electrodes 2b) in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer are the electrical interconnect lines 2 (including the optical element mounting pads 2a and the grounding electrodes 2b). Although the semi-additive process is described above, a subtractive process may be used instead.

Figure 2C:
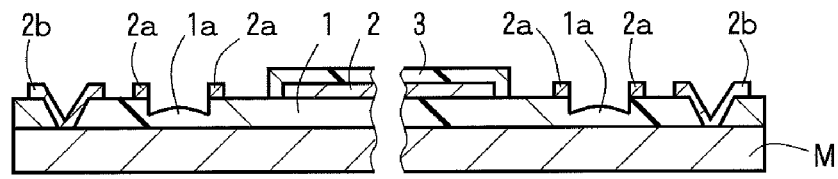

Then, an electroless plated layer made of nickel and the like (not shown) is formed on the front surface of the electrical interconnect lines 2 (including the optical element mounting pads 2a and the grounding electrodes 2b). Thereafter, as shown in FIG. 2C, a photosensitive insulating resin including a polyimide resin and the like is applied to a portion of the electrical interconnect lines 2 other than the optical element mounting pads 2a and the grounding electrodes 2b to form the coverlay 3 by a photolithographic process.

Figure 2D:
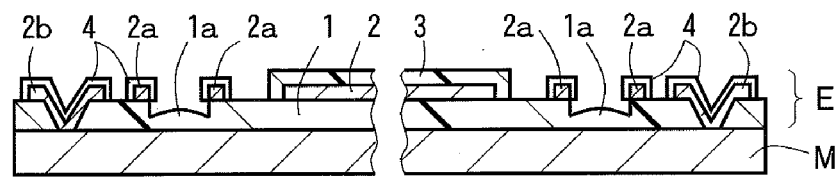

Then, the electroless plated layer (not shown) formed on the optical element mounting pads 2a and the grounding electrodes 2b is removed by etching. Thereafter, electroplated layers 4 made of gold, nickel and the like are formed in sites where the electroless plated layer is removed, as shown in FIG. 2D. In this manner, the electric circuit board E is formed on the front surface of the metal layer M.

Next, a photosensitive resist (not shown) is laminated to the opposite surfaces of a laminate comprised of the metal layer M and the electric circuit board E. Thereafter, holes are formed by a photolithographic process in portions of the photosensitive resist on the back surface (the surface opposite from the electric circuit board E) of the metal layer M which correspond to portions where the through holes for an optical path are to be formed, so that back surface portions of the metal layer M are uncovered at the bottoms (the top surfaces as seen in the figure) of the holes.

Figure 2E:
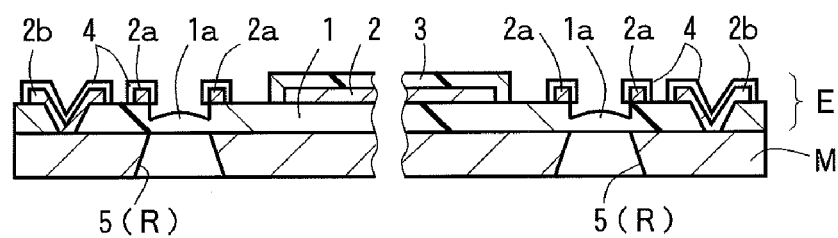
FIG. 2E is an illustration schematically showing the step of etching a metal layer in the opto-electric hybrid board.

Then, as shown in FIG. 2E, the portions of the metal layer M uncovered at the bottoms of the holes are removed by etching using an aqueous etching solution for the metal material of the metal layer M (for example, an aqueous ferric chloride solution for a stainless steel layer), so that the insulative layer 1 is uncovered at the bottoms (the top surfaces as seen in the figure) of sites R where the metal layer M is removed. Thereafter, the photosensitive resist is stripped away using an aqueous sodium hydroxide solution and the like. The sites R where the metal layer M is removed are the through holes 5 for an optical path.

Figure 3A:
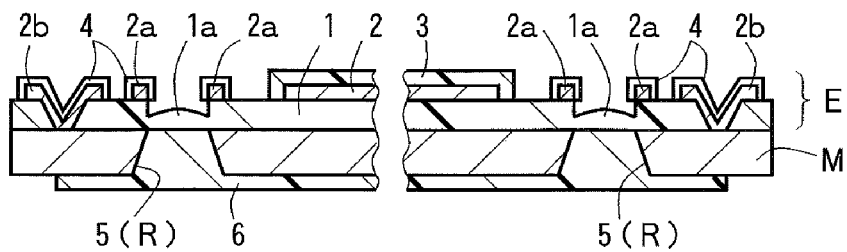
FIGS. 3A to 3D are illustrations schematically showing the steps of producing an optical waveguide in the opto-electric hybrid board.

For the formation of the optical waveguide W (with reference to FIG. 3D) on the back surface of the metal layer M, a photosensitive resin which is a material for the formation of the under cladding layer 6 is applied to the back surface (the lower surface as seen in the figure) of the metal layer M, as shown in FIG. 3A. Thereafter, the applied layer is exposed to irradiation light. This exposure cures the applied layer to form the under cladding layer 6. The under cladding layer 6 enters and fills the through holes 5 for an optical path (the sites R) where the metal layer M is removed by etching. The under cladding layer 6 has a thickness (as measured from the back surface of the insulative layer 1) in the range of 5 to 200 μm, for example. It should be noted that the back surface of the metal layer M is positioned to face upward when the optical waveguide W is formed (when the aforementioned under cladding layer 6, the cores 7 to be described later and the over cladding layer 8 to be described later are formed).

Figure 3B:
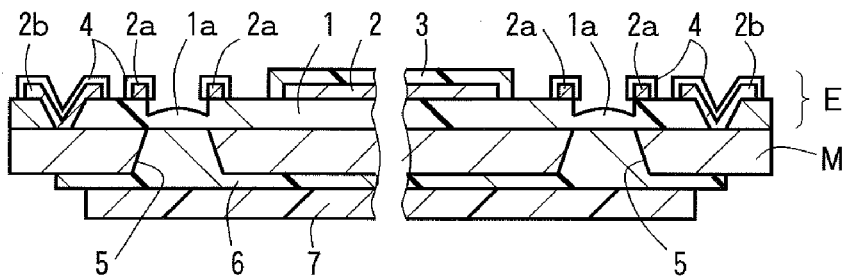

Then, as shown in FIG. 3B, the cores 7 having a predetermined pattern are formed on the front surface (the lower surface as seen in the figure) of the under cladding layer 6 by a photolithographic process. The cores 7 have a thickness in the range of 5 to 200 μm, and a width in the range of 5 to 200 μm. An example of a material for the formation of the cores 7 includes a photosensitive resin similar to that for the under cladding layer 6, and the material used herein has a refractive index higher than that of the material for the formation of the aforementioned under cladding layer 6 and the over cladding layer 8 to be described below (with reference to FIG. 3C). The adjustment of the refractive index may be made, for example, by adjusting the selection of the types of the materials for the formation of the under cladding layer 6, the cores 7 and the over cladding layer 8, and the composition ratio thereof.

Figure 3C:
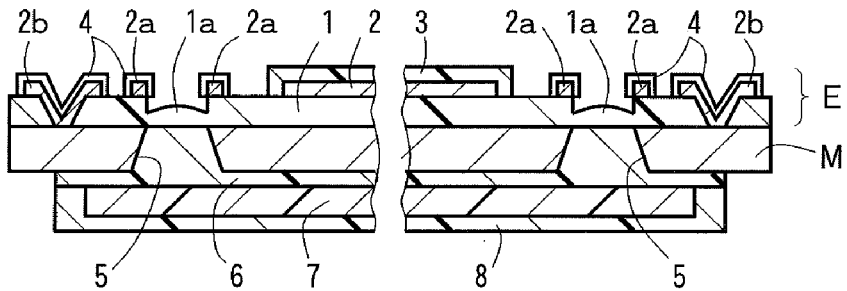

Next, as shown in FIG. 3C, the over cladding layer 8 is formed on the front surface (the lower surface as seen in the figure) of the under cladding layer 6 by a photolithographic process so as to cover the cores 7. The over cladding layer 8 has a thickness (as measured from the front surface of the under cladding layer 6) not less than that of the cores 7 and not greater than 200 μm. An example of a material for the formation of the over cladding layer 8 includes a photosensitive resin similar to that for the under cladding layer 6.

Figure 3D:
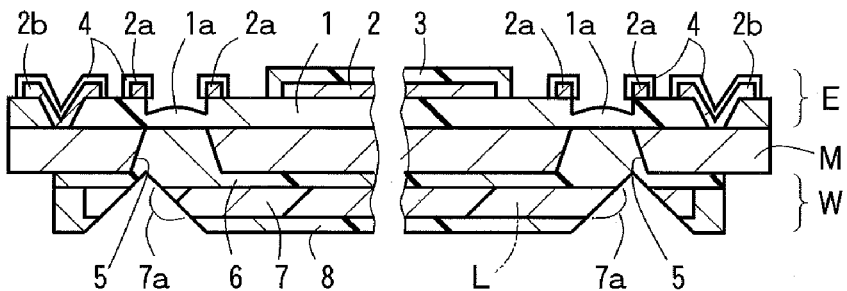

Then, as shown in FIG. 3D, portions (opposite end portions) of the optical waveguide W (positioned in a lower part as seen in the figure) corresponding to the optical element mounting pads 2a of the electric circuit board E are formed into inclined surfaces inclined at 45 degrees with respect to the longitudinal direction of the cores 7 by laser beam machining, cutting using a rotary blade and the like having an included angle of 90 degrees, and the like. Portions of the cores 7 positioned at the inclined surfaces function as the light reflecting surfaces 7a. In this manner, the optical waveguide W is formed on the back surface of the metal layer M.

Thereafter, the light-emitting element 11 and the light-receiving element 12 (with reference to FIG. 1) are mounted on the optical element mounting pads 2a. This provides the opto-electric hybrid board shown in FIG. 1.

Figure 4:
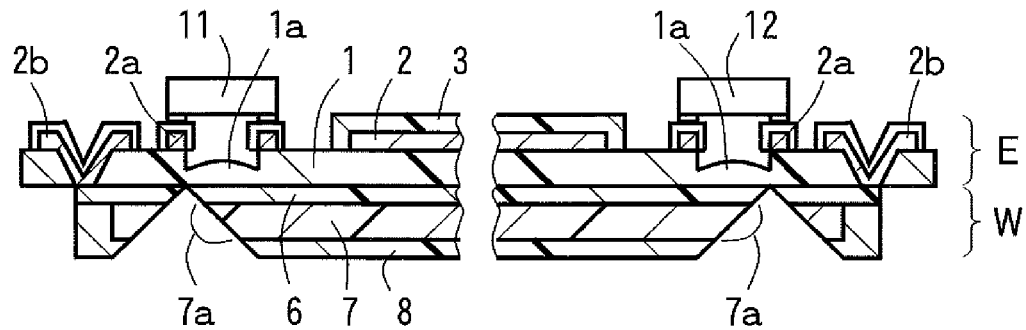
FIG. 4 is a longitudinal sectional view schematically showing an opto-electric hybrid board according to a second preferred embodiment.

FIG. 4 is a longitudinal sectional view schematically showing an opto-electric hybrid board according to a second preferred embodiment. The opto-electric hybrid board according to the second preferred embodiment is configured such that the metal layer M is not used in the opto-electric hybrid board according to the first preferred embodiment (with reference to FIG. 1). Other parts of the second preferred embodiment are similar to those of the first preferred embodiment. Like reference numerals and characters are used to designate parts similar to those of the first preferred embodiment.

The opto-electric hybrid board according to the second preferred embodiment is produced in a manner to be described below. For example, the electric circuit board E is formed on a releasable base in a manner similar to that in the first preferred embodiment. Thereafter, the releasable base is released from the electric circuit board E. Then, the optical waveguide W is formed on the back surface (a surface opposite from the surface with the electrical interconnect lines 2 formed thereon) of the insulative layer 1 of the electric circuit board E in a manner similar to that in the first preferred embodiment.

Figure 5:
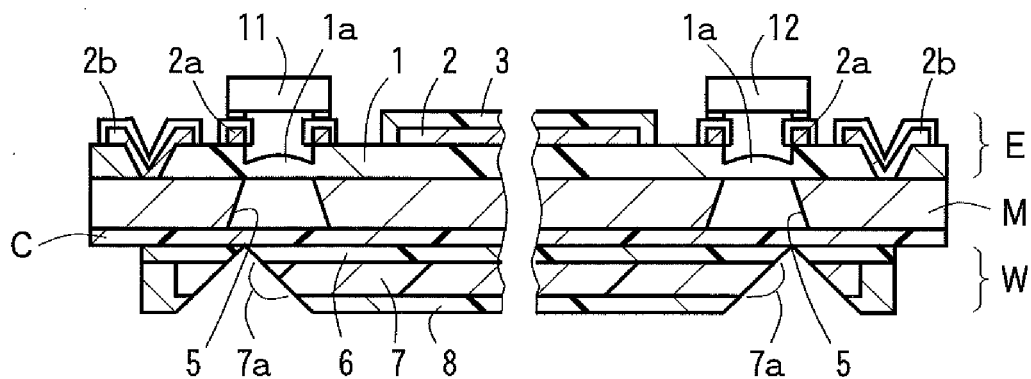
FIG. 5 is a longitudinal sectional view schematically showing an opto-electric hybrid board according to a third preferred embodiment.

FIG. 5 is a longitudinal sectional view schematically showing an opto-electric hybrid board according to a third preferred embodiment. The opto-electric hybrid board according to the third preferred embodiment is configured such that the metal layer M and the optical waveguide W in the opto-electric hybrid board according to the first preferred embodiment (with reference to FIG. 1) adhere to each other with a light-transmissive adhesive sheet C and such that the under cladding layer 6 does not enter and fill the through holes 5 for an optical path formed in the metal layer M. Other parts of the third preferred embodiment are similar to those of the first preferred embodiment. Like reference numerals and characters are used to designate parts similar to those of the first preferred embodiment.

The opto-electric hybrid board according to the third preferred embodiment is produced in a manner to be described below. The electric circuit board E is formed on the front surface of the metal layer M in a manner similar to that in the first preferred embodiment. Thereafter, the optical waveguide W produced in a separate step is caused to adhere to the back surface of the metal layer M with the light-transmissive adhesive sheet C. Examples of a material for the formation of the light-transmissive adhesive sheet C include epoxy resins, acrylic resins and phenolic resins. The adhesive sheet C has a thickness in the range of 1 to 200 μm, for example.

Figure 6:
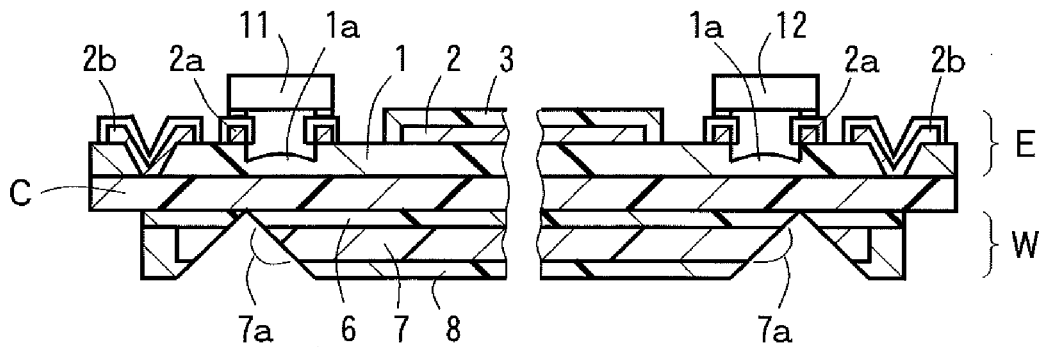
FIG. 6 is a longitudinal sectional view schematically showing an opto-electric hybrid board according to a fourth preferred embodiment.
Figure 7:
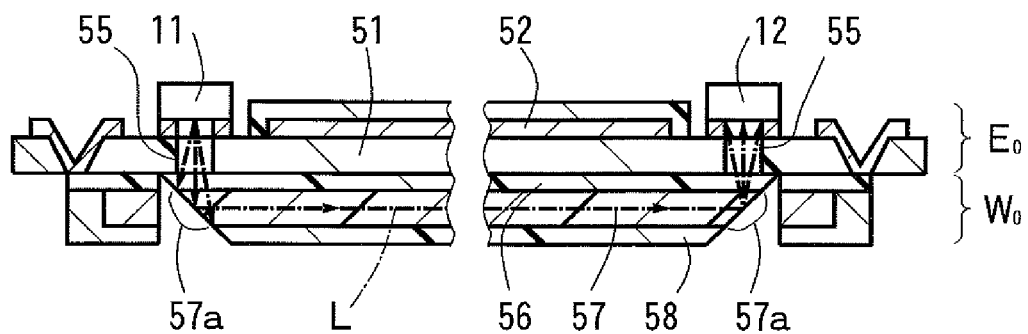
FIG. 7 is a longitudinal sectional view schematically showing a conventional opto-electric hybrid board.
Figure 8:
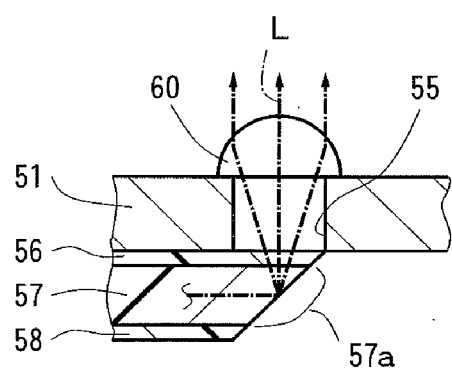
FIG. 8 is a longitudinal sectional view schematically showing a conventional optical wiring board.

FIG. 6 is a longitudinal sectional view schematically showing an opto-electric hybrid board according to a fourth preferred embodiment. The opto-electric hybrid board according to the fourth preferred embodiment is configured such that the electric circuit board E and the optical waveguide W in the opto-electric hybrid board according to the second preferred embodiment (with reference to FIG. 4) adhere to each other with a light-transmissive adhesive sheet C similar to that in the third preferred embodiment. Other parts of the fourth preferred embodiment are similar to those of the second preferred embodiment. Like reference numerals and characters are used to designate parts similar to those of the second preferred embodiment.

The opto-electric hybrid board according to the fourth preferred embodiment is produced in a manner to be described below. The electric circuit board E produced in a separate step and the optical waveguide W produced in a separate step are caused to adhere to each other with the light-transmissive adhesive sheet C.

The insulative layer 1 having the lens portions 1a is formed by a photolithographic process in the aforementioned preferred embodiments, but may be formed by laser etching or metal molding.

The first and second lens portions 1a are formed in the portions of the insulative layer 1 corresponding to the light-emitting element 11 and the light-receiving element 12, respectively, in the aforementioned preferred embodiments.

However, when the efficiency of the propagation of the light beam L is sufficient, only one of the first and second lens portions 1a may be formed in some instances.

Further, the lens portions 1a of the insulative layer 1 are in the form of convex lenses in the aforementioned preferred embodiments. However, the lens portions 1a may be in the form of other lenses such as concave lenses so long as the lenses are capable of restraining or converging a diffused light beam.

When the insulative layer 1 is formed in the aforementioned preferred embodiments, alignment marks for the positioning of the electrical interconnect lines 2 may be formed on the front surface of the insulative layer 1 by the aforementioned photolithographic process, laser etching or metal molding. This improves the accuracy of the position where the electrical interconnect lines 2 are formed relative to the insulative layer 1. The position of the aforementioned alignment marks is defined, for example, in upper and lower portions of the insulative layer 1, in left-hand and right-hand portions thereof, and in four corners thereof.

When the insulative layer 1 is formed in the aforementioned preferred embodiments, alignment marks for the positioning of the light-emitting element 11 and the light-receiving element 12 may be formed on the front surface of the insulative layer 1 by the aforementioned photolithographic process, laser etching or metal molding. This improves the accuracy of the position where the light-emitting element 11 and the light-receiving element 12 are mounted relative to the insulative layer 1. The position of the aforementioned alignment marks is defined, for example, near the optical element mounting pads 2a.

When the insulative layer 1 is formed in the aforementioned preferred embodiments, vias (via holes) may be formed in the insulative layer 1 by the aforementioned photolithographic process, laser etching or metal molding.

Next, inventive examples of the present invention will be described in conjunction with a comparative example. It should be noted that the present invention is not limited to the inventive examples.

EXAMPLES

Inventive Examples 1 to 4

The opto-electric hybrid board in the first preferred embodiment was prepared as an opto-electric hybrid board in Inventive Example 1, and the opto-electric hybrid board in the second preferred embodiment was prepared as an opto-electric hybrid board in Inventive Example 2. The opto-electric hybrid board in the third preferred embodiment was prepared as an opto-electric hybrid board in Inventive Example 3, and the opto-electric hybrid board in the fourth preferred embodiment was prepared as an opto-electric hybrid board in Inventive Example 4. In each of Inventive Examples 1 to 4, an insulative layer made of a polyimide resin and having lens portions was formed on a front surface of stainless steel foil (SUS304H-TA; a metal layer) having a thickness of 20 µm by a photolithographic process using a photomask. Portions of the photomask corresponding to the lens portions had an average transmittance which was 80% of that of other portions thereof, and the average transmittance was decreased gradually. The insulative layer had a total light transmittance of 70% at a wavelength of 600 nm.

Comparative Example

An opto-electric hybrid board similar to that in Inventive Example 1 except that the insulative layer had no lens portions was prepared as an opto-electric hybrid board in Comparative Example. Other parts of Comparative Example were similar to those of Inventive Example 1.

<Coupling Loss of Light>

A VCSEL (850-05-1×1 available from U-L-M photonics GmbH) was prepared as a light-emitting element, and a photodiode (TPD-8D12-014 available from Roithner Lasertechnik GmbH) was prepared as a light-receiving element. The amount of light $I_0$ was measured when light emitted from the VCSEL was directly received by the photodiode. Then, the VCSEL and the photodiode were mounted. Thereafter, the amount of light I was measured when light emitted from the VCSEL was received by the photodiode via cores of an optical waveguide in each of the opto-electric hybrid boards. The ratio ($I_0$/I) was calculated, and the calculated value was determined as the propagation loss of light. On the other hand, the propagation loss of light in an intermediate portion of the optical waveguide which was determined by a cutback technique was 0.1 dB/cm. Based on this value and the propagation loss of light in each opto-electric hybrid board, a coupling loss in each opto-electric hybrid board was calculated. The results were listed in Table 1 below.

TABLE 1

|  | Inv. Ex. 1 | Inv. Ex. 2 | Inv. Ex. 3 | Inv. Ex. 4 | Comp. Ex. |
| --- | --- | --- | --- | --- | --- |
| Lenses |  | Yes |  |  | No |
| Coupling Loss (dB) | 1.5 | 1.5 | 1.5 | 2.0 | 5.0 |

The results in Table 1 show that the coupling loss is low in Inventive Examples 1 to 4 in which the insulative layer has the lens portions, whereas the coupling loss is high in Comparative Example in which the insulative layer has no lens portions.

The opto-electric hybrid board is usable in instances where the coupling loss between an optical element and a core is to be decreased.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
an electric circuit board including an insulative layer having front and back surfaces, and electrical interconnect lines being formed on the front surface of the insulative layer;
an optical element mounted on a surface of the electric circuit board with the electrical interconnect lines formed thereon; and
an optical waveguide including a core, an under cladding layer and an over cladding layer and formed on the back surface of the insulative layer of the electric circuit board,
wherein the core includes at an end portion thereof a reflecting portion capable of reflecting light to propagate the light between the core and the optical element,
wherein the insulative layer is made of a light-transmissive material,
wherein the insulative layer includes a portion corresponding to an optical path between the reflecting portion of the core and the optical element, the corresponding portion of the insulative layer being in the form of a lens portion, and wherein the lens portion is formed in a region recessed from the front surface of the insulative layer.

2. The opto-electric hybrid board according to claim 1, wherein the light-transmissive material of the insulative layer is a photosensitive resin, and wherein the lens portion is formed by gradation exposure during a photolithographic process.

3. The opto-electric hybrid board according to claim 1, wherein the insulative layer has a light transmittance of not less than 70% at a wavelength of not less than 600 nm.

4. The opto-electric hybrid board according to claim 1, wherein the insulative layer is a heat-resistant layer having resistance to heat at 150° C. or higher.

5. The opto-electric hybrid board according to claim 1, wherein a metal layer is formed between the insulative layer and the optical waveguide, and wherein a through hole for an optical path is formed in a portion of the metal layer corresponding to the optical path between the reflecting portion and the optical element formed on the core.

6. The opto-electric hybrid board according to claim 5, wherein a grounding electrode which is in contact with the metal layer is formed on the front surface of the insulative layer.

7. An opto-electric hybrid board, comprising:

an electric circuit board including an insulative layer having front and back surfaces, and electrical interconnect lines being formed on the front surface of the insulative layer;

an optical element mounted on a surface of the electric circuit board with the electrical interconnect lines formed thereon; and an optical waveguide including a core, an under cladding layer and an over cladding layer and formed on the back surface of the insulative layer of the electric circuit board, wherein the core includes at an end portion thereof a reflecting portion capable of reflecting light to propagate the light between the core and the optical element, wherein the insulative layer is made of a light-transmissive material, wherein the insulative layer includes a portion corresponding to an optical path between the reflecting portion of the core and the optical element, the corresponding portion of the insulative layer being in the form of a lens portion, wherein a metal layer is formed between the insulative layer and the optical waveguide, wherein a through hole for an optical path is formed in a portion of the metal layer corresponding to the optical path between the reflecting portion and the optical element formed on the core, and wherein a grounding electrode which is in contact with the metal layer is formed on the front surface of the insulative layer.

8. The opto-electric hybrid board according to claim 7, wherein the light-transmissive material of the insulative layer is a photosensitive resin, and wherein the lens portion is formed by gradation exposure during a photolithographic process.

9. The opto-electric hybrid board according to claim 7, wherein the insulative layer has a light transmittance of not less than 70% at a wavelength of not less than 600 nm.

10. The opto-electric hybrid board according to claim 7, wherein the insulative layer is a heat-resistant layer having resistance to heat at 150° C. or higher.

11. The opto-electric hybrid board according to claim 7, wherein the lens portion is formed in a region recessed from the front surface of the insulative layer.

* * * * *